(12) United States Patent
Doljack

(10) Patent No.: US 7,148,697 B2
(45) Date of Patent: Dec. 12, 2006

(54) SYSTEM AND METHOD FOR MEASURING ELECTRICAL CHARACTERISTICS OF A CAPACITOR

(76) Inventor: Frank A. Doljack, 750 Montevino Dr., Pleasanton, CA (US) 94566

( * ) Notice: Subject to any disclaimer, the term of this patent is extended or adjusted under 35 U.S.C. 154(b) by 0 days.

(21) Appl. No.: 10/861,550

(22) Filed: Jun. 4, 2004

(65) Prior Publication Data

US 2005/0270042 A1 Dec. 8, 2005

(51) Int. Cl.
*G01R 31/12* (2006.01)
*G01R 27/26* (2006.01)

(52) U.S. Cl. .................. 324/548; 324/678; 324/658

(58) Field of Classification Search ........ 324/676–678, 324/658–663, 686–690, 76.16, 548
See application file for complete search history.

(56) References Cited

U.S. PATENT DOCUMENTS

| | | | | |
|---|---|---|---|---|
| 4,825,147 A | * | 4/1989 | Cook et al. | 324/678 |
| 5,073,757 A | | 12/1991 | George | 324/677 |
| 5,136,251 A | | 8/1992 | George et al. | 324/678 |
| 5,321,403 A | | 6/1994 | Eng, Jr. et al. | 341/168 |
| 5,497,095 A | * | 3/1996 | Ueyama et al. | 324/537 |
| 5,576,628 A | * | 11/1996 | Caliboso et al. | 324/678 |
| 5,585,733 A | * | 12/1996 | Paglione | 324/678 |
| 5,880,589 A | | 3/1999 | Okano | 324/548 |
| 5,936,409 A | * | 8/1999 | Nishioka | 324/548 |
| 6,043,665 A | | 3/2000 | Nishioka et al. | 324/678 |
| 6,191,723 B1 | * | 2/2001 | Lewis | 341/166 |
| 6,275,047 B1 | * | 8/2001 | Zoellick et al. | 324/678 |
| 6,356,086 B1 | * | 3/2002 | Cook et al. | 324/659 |

OTHER PUBLICATIONS

R.B Wright and T.C. Murphy, "Evaluation of Saft America, Inc. Electrochemical Capacitors," Idaho National Engineering Laboratory, INEL/EXT-97-01414, Dec. 1997.
"What's the Role of the Supercapacitor," Downloaded from the Internet at http://www.batteryuniversity.com/partone-8.htm on May 21, 2004.

* cited by examiner

*Primary Examiner*—Andrew H. Hirshfeld
*Assistant Examiner*—Jeff Natalini
(74) *Attorney, Agent, or Firm*—Renner, Otto, Boisselle & Sklar, LLP

(57) ABSTRACT

Disclosed are a system and method for measuring electrical characteristics of a capacitor. A measurement assembly can include a constant current assembly for selectively charging and discharging the capacitor and a counter incremented during a measurement period of a selected one of the charging and discharging. A display is used to display a value of the counter as a representation of capacitance of the capacitor.

40 Claims, 5 Drawing Sheets

US 7,148,697 B2

SYSTEM AND METHOD FOR MEASURING ELECTRICAL CHARACTERISTICS OF A CAPACITOR

TECHNICAL FIELD

The present invention relates generally to the field of measuring the electrical characteristics of a capacitor and, more particularly, to a system and method for measuring the charge capacitance, discharge capacitance and equivalent series resistance (ESR) of a capacitor. The system and method are well suited for use in analyzing an electric double layer capacitor (EDLC).

BACKGROUND

Electric double layer capacitors (EDLCs), which are commonly referred to in the art by the terms supercapacitors, ultracapacitors and electrochemical capacitors, can provide a relatively high capacitance in a relatively small package. EDLCs typically include a pair of electrodes separated by an electrolyte. Similar to conventional capacitors that are formed from, for example, conductive foils and a dry separator, a static charge can be stored by an EDLC by applying a voltage differential across the electrodes to allow electrical charge to "build up" in the capacitor. Common electrode materials include high surface area activated carbons, metal oxides and conductive polymers. The electrolyte can be aqueous or organic. EDLCs can have a capacitance from under 1 farad (e.g., about 0.005 F) to over 10,000 farads.

Unfortunately, the electrical characteristics of EDLCs have proven difficult to measure using techniques that are suitable for evaluating the electrical characteristics of conventional capacitors. Several attempts to measure the capacitance of EDLCs have been made. For example, R. B. Wright and T. C. Murphy, "Evaluation of Saft America, Inc. Electrochemical Capacitors," Idaho National Engineering Laboratory, INEL/EXT-97-01414, December, 1997, describes a measurement approach where the capacitor is charged (or discharged) under constant current conditions. The time between two voltage points as the voltage across the capacitor changes is measured. Thereafter, the capacitance is mathematically calculated using the current, time and voltage difference. The disclosed calculation assumes that the capacitor can be represented by a model of an ideal capacitor. However, most, if not all, EDLCs are non-ideal capacitors and non-ideal capacitors cannot be easily represented by a simple model of an ideal capacitor. An ideal, or nonlinear, capacitor has a transferred charge characteristic that is single-valued. More specifically, ideal capacitors have a mean-charge characteristic or a peak-charge characteristic that is not linear, or a reversible capacitance that varies with bias voltage. The Wright publication also describes an ESR measurement where the result is generated by mathematical calculations involving current and voltage differences.

U.S. Pat. No. 6,275,047 describes another technique for measuring capacitance. In particular, a processor is used to multiply a differential time value by the constant current and divide the product by a differential voltage value to arrive at a capacitance value.

As should be apparent, measurement systems that rely on mathematical computations require some sort of processor that has been programmed to carry out the computations. As such, there is a need in the art for simplified systems and methods for measuring the electrical characteristics of EDLCs, such as systems and method that do not include performing mathematical computations (e.g., multiplication and/or division) and have reduced reliance on a model of an ideal capacitor.

SUMMARY OF THE INVENTION

According to one aspect of the invention, the invention is directed to a measurement assembly for measuring an electrical characteristic of a capacitor. The measurement assembly can include a constant current assembly for selectively charging and discharging the capacitor; a counter incremented during a measurement period of a selected one of the charging and discharging; and a display driven to display a value of the counter as a representation of capacitance of the capacitor.

According to another aspect of the invention, the invention is directed to a method of measuring an electrical characteristic of a capacitor. The method can include selectively charging or discharging the capacitor with a constant current; incrementing a counter during a measurement period of the selected one of the charging and discharging; and displaying a value of the counter as a representation of capacitance of the capacitor.

According to yet another aspect of the invention, the invention is directed to a method of measuring an equivalent series resistance (ESR) of a capacitor. The method can include charging the capacitor to about a working voltage of the capacitor; beginning a constant current discharge of the capacitor; shutting off the discharge of the capacitor after an initial discharge step to invoke a recovery rise in voltage across the capacitor; and measuring a magnitude of the rise, the magnitude of the rise being directly proportional to the ESR of the capacitor.

According to still another aspect of the invention, the invention is directed to a method of detecting an error condition during measurement of an electrical characteristic of a capacitor. The measurement can include, for example, selectively charging or discharging the capacitor with a constant current and monitoring the capacitor over a measurement period. The method can include determining a change in voltage across the capacitor during each of a plurality of time intervals during the measurement period; comparing the change in voltage for each time interval to a threshold value; and outputting an error condition indication signal if the change in voltage for any of the time intervals exceeds the threshold voltage.

BRIEF DESCRIPTION OF DRAWINGS

These and further features of the present invention will be apparent with reference to the following description and drawings, wherein.

DISCLOSURE OF INVENTION

Figure 1:
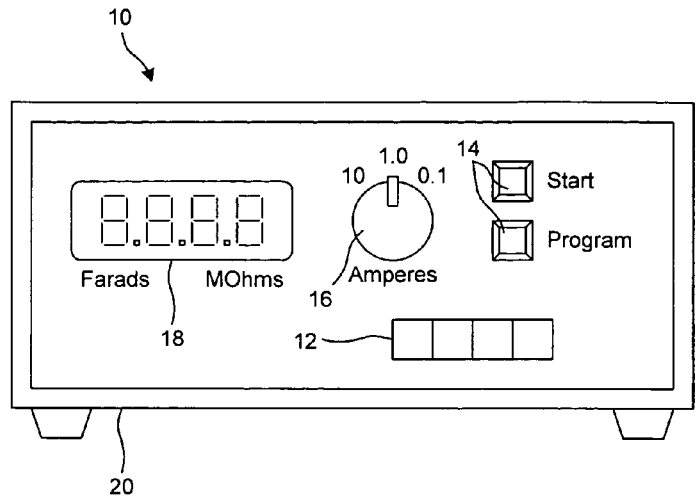
FIG. 1 is front view of a measurement assembly according to the present invention.

In the detailed description that follows, like components have been given the same reference numerals, regardless of whether they are shown in different embodiments of the present invention. To illustrate the present invention in a clear and concise manner, the drawings may not necessarily be to scale and certain features may be shown in somewhat schematic form.

Introduction

Aspects of the present invention relate to a system and method for measuring various electrical characteristics of a capacitor. The capacitor undergoing measurement is referred to herein as a device under test (DUT) or tested capacitor. The tested capacitor can be an electric double layer capacitor (EDLC), which is defined herein to include devices known in the art as supercapacitors, ultracapacitors and electrochemical capacitors. Alternatively, the tested capacitor can be a conventional capacitor. It is noted that EDLCs have some commonality with batteries. As a result, the systems and methods described herein can have application in measuring characteristics of a battery. Accordingly, the DUT can be any of an EDLC, a conventional capacitor, a battery and any other component that has an electrical characteristic that can be measured by monitoring a particular parameter and that particular parameter is indicative of the desired characteristic when certain variables of a governing equations are preselected in a designated manner.

For purposes of this description, the DUT is preferably an EDLC and the illustrated and described measurement system is suitably adapted for measuring the charge capacitance, discharge capacitance and ESR of the EDLC. However, the invention is not correspondingly limited to measuring the electrical characteristics of an EDLC.

Measurement of an electrical characteristic according to certain aspects of the present invention involves monitoring a particular parameter that, when all other parameters are preselected to satisfy a governing equation, is indicative of the desired electrical characteristic. In some instances, preselection of the parameters that satisfy the governing equation also includes selection of a decimal point location for the monitored parameter. As will become increasingly more apparent from the description herein, mathematical calculations, such as multiplication and division, are eliminate or kept to a minimum when determining the electrical characteristic of the DUT.

For example, when measuring capacitance of the DUT, constant current is used to charge or discharge the DUT. As used herein, the term constant current means a current that has a desired value within an acceptable tolerance range. Therefore, the term constant current expressly includes a current that fluctuates with respect to and deviates from a target current value. When the DUT reaches a preselected first voltage point, a counter is turned on to count pulses having a preselected pulse period (period being the inverse of frequency). In this example, the pulses themselves are the monitored parameter. When the DUT reaches a preselected second voltage point, the counter is stopped. The non-monitored values (e.g., the current, first and second voltage points and pulse period) are preselected such that the number of counted pulses is representative of capacitance. Therefore, the number of counted pulses is displayed to the user as representing capacitance. Certain preselected parameter values can result in a direct correlation of counted pulses to capacitance, while others may prompt insertion of a decimal point between digits of the number of counted pulses to display capacitance in a desired unit (e.g., farads or millifarads). The placement of the decimal point relative to the digits of the number of counted pulses is known from the preselected values and can be inserted by driving the display to include the decimal place.

Measurement Assembly

Referring now to FIG. 1, shown is a measurement assembly 10 that measures at least the following electrical characteristics of a DUT: charge capacitance, discharge capacitance and ESR. The measurement assembly includes a terminal block 12 for establishing electrical connection to the DUT; user input devices 14, such as the illustrated buttons; a constant current selection device 16, such as a rotary switch; and an output display 18, such as a segmented liquid crystal display (LCD). As illustrated, the terminal block 12, the input devices 14, the current selector 16 and the display 18 can be mounted to a housing such that the measurement assembly 10 can be disposed on, for example, a laboratory bench or mounted in a rack. In alternative arrangements, the measurement assembly 10 can form part of a larger test unit that performs additional tests and/or analysis of the DUT.

The terminal block 12 can comprise one or more sets of connectors. For example, to establish connection to a DUT using a relatively small constant current (e.g., about 0.1 A or about 1.0 A), the terminal block 12 can include a four terminal Kelvin socket. To establish connection to a DUT having a relatively high capacitance (e.g., about 100 farads or more) using a relatively large constant current (e.g., about 10 A), the terminal block 12 can include a barrier block. The barrier block can have, for example, a plurality of screw terminals. A pair of the screw terminals can be used as current carrying members and other screw terminals can be used as voltage sensing members.

Figure 2:
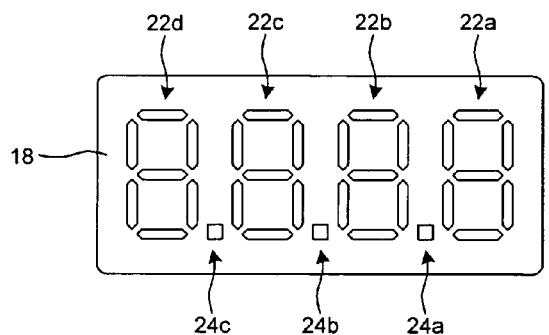
FIG. 2 is an enlarged view of an example display for the measurement assembly.

FIG. 2 illustrates an enlarged view of the display 18. The display 18 is not limited to a segmented LCD and can comprise, for example, a CRT, a plasma display, an LCD monitor, groupings of LEDs, and so forth. From these examples, segmented LCDs and LED groupings may be limited in the content that can be displayed, such a predetermined number of alphanumeric characters and decimal point locations. Other displays may have greater flexibility in displaying content and may be capable of displaying a larger number of alphanumeric characters and decimal point locations.

In the illustrated embodiment, the display 18 includes a plurality of digits 22a through 22d. Although four digits 22 are illustrated, the display 18 can include a larger or smaller number of digits 22. By selectively "turning on" individual portions of the digits 22, each digit 22 is capable of displaying numbers from zero (0) to nine (9). Alphabetical characters can also be displayed using the digits 22. Between each pair of adjacent digits 22 can be a decimal point location 24. Starting from the right of the display 18 and working left, turning on a first decimal point location 24a between a first digit 22a and a second digit 22b can give the appearance that the first digit 22a is displaying tenths of the prescribed unit (e.g., farads for capacitance or milliohms for resistance). Similarly, turning on a second decimal point location 24b between the second digit 22b and the third digit 22c can give the appearance that the first digit 22a displays hundredths and the second digit 22b displays tenths. Turning on a third decimal point location 24c between the third digit 22c and a fourth digit 22d can give the appearance that the first digit 22a displays thousandths, the second digit 22b displays hundredths and the third digit 22c displays tenths.

Figure 3:
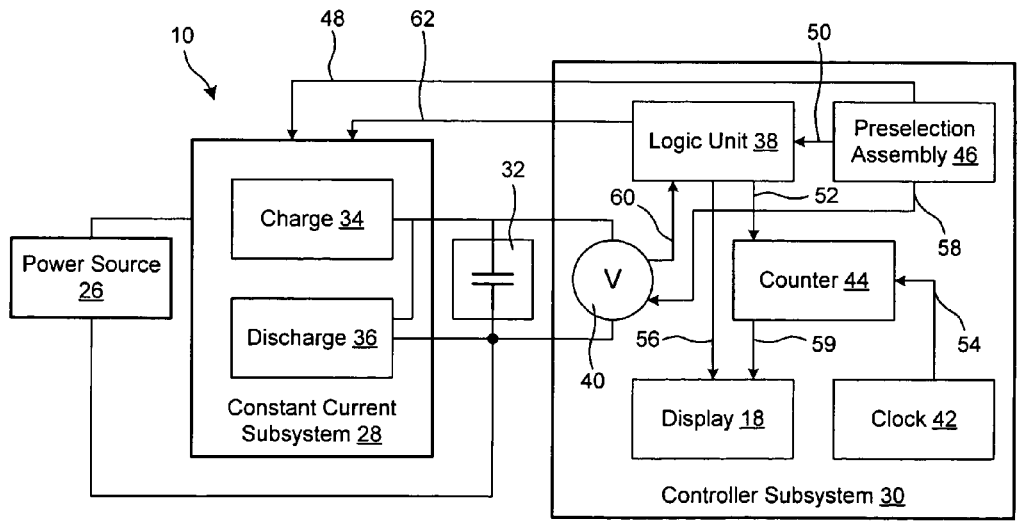
FIG. 3 is a schematic block diagram of the measurement assembly.

With additional reference to FIG. 3, a schematic block diagram of the measurement assembly 10 is shown. The measurement assembly 10 can include a power source 26, such as a DC voltage source; a constant current subsystem 28; and a controller subsystem 30. The power source 26 supplies power, such as a DC voltage, to the constant current subsystem 28 and controller subsystem 30. During charging of a DUT 32 (e.g., an EDLC), a constant current charging circuit 34 of the constant current subsystem 28 draws current from the power source 26 to charge the DUT 32. During discharging of the DUT 32, a constant current discharging circuit 36 of the constant current subsystem 28 discharges current to ground.

During both charging and discharging, the constant current subsystem 28 forces current to flow at a preselected value and remain generally constant during at least respective measurement portions of the charging and discharging operations. In one embodiment, one preselected current value is available. In the illustrated embodiment, multiple preselected current values are available and a desired one of the preselected current values can be selected by the user by positioning of the constant current selection device 16.

The controller subsystem 20 includes a logic unit 38 that controls overall operation of the measurement assembly 10; a voltage measuring device 40 that measures voltage across the DUT 32; a clock 42 for generating a repeating and, hence, countable signal (such as a series of pulses, a sine wave, a square wave, etc.) at a preselected frequency or pulse rate; a counter 44 that, under the control of the logic unit 38, starts and stops counting the countable signal received from a clock 42; a preselection assembly 46 for outputting control signals in accordance with user settings; and the display 18.

The user interacts with the preselection assembly by selecting one of the choices for preselected constant currents using the constant current selection device 16. A working voltage for the DUT 32 may also be selected. As will be described in greater detail below, selecting the working voltage for the DUT 32 can invoke the use of a set a preselected parameters corresponding to the selected working voltage. These preselected parameters can include a preselected first voltage point, used to start the counter during a charge capacitance measurement and used to stop the counter during a discharge capacitance measurement; a preselected second voltage point, used to stop the counter during a discharge capacitance measurement and used to start the counter during a discharge capacitance measurement; and a preselected period for the countable signal. Nearly all EDLCs have one of two working voltages (e.g., 2.5 volts and 5.0 volts), but the measurement assembly 10 can be adapted to measure the electrical characteristics of a DUT 32 having nearly any working voltage. To specify the working voltage of the DUT 32, the user can scroll through available preprogrammed working voltage choices having associated preselected parameters for the first voltage point, the second voltage point and the countable signal period. For instance, the user can hold down one of the user input devices 14 (e.g., a program button) and press another of the user input devices 14 (e.g., a start button) until the desired working voltage is displayed on the display 18.

During testing of the DUT 32, the preselection assembly 46 commands the charge circuit 34 and the discharge circuit 36 of the constant current subsystem 28 to respectively charge and discharge with preselected constant current over control line(s) 48. Control line(s) 50 is used by the preselection assembly 46 to invoke the logic unit 38 to send commands over control line(s) 52 to the counter 44 for the counter 44 to use an appropriate scaling factor. The scaling factor can be used to adjust a static frequency of a signal generated by the clock 42 and sent to the counter over line(s) 54 to have a period corresponding to the preselected period of the countable signal. The preselection assembly 46 also can invoke the logic unit 38 to command the display 18, over control line(s) 56, to display a decimal point in a desired location using one of the decimal point locations 24. The location of the decimal point, if any, can be extracted from a look-up table using the preselected constant current value. The preselection assembly 46 sends signals to the voltage measuring device 40 over control line(s) 58 to set the first and second voltage points. The counter 44 can drive the display 18 to display a counted value over line 59.

As should be understood, the preselection assembly 46, or components carrying out the functionality of the preselection assembly 46, can be omitted in circumstances where only one constant current value and only one working voltage for the DUT 32 is available. In this circumstance, the values for the first voltage point, the second voltage point and the period of the countable signal, as well as the location of the decimal point, can be statically preselected.

In one embodiment, the clock 42 delivers a series of pulses or other signal having a static frequency to the counter 44 over line 54. To assist in setting the period of the countable signal to a preselected value, the counter 44 may apply a scaling factor to the received signal. For example, the counter 44 can be implemented to increment a value of the counter 44 every nth cycle of the received signal, where n is an appropriate integer preselected based on the preselected constant current and/or working voltage. In this manner, the count maintained by the counter 44 can be incremented at desired intervals, such as every 0.015 seconds or every 0.03 seconds.

In a capacitance measuring mode, the voltage measuring device 40 sends a signal to the logic unit 38 that indicates detection of a voltage corresponding to the first voltage point across the DUT 32 over control line(s) 60. Similarly, the voltage measuring device 40 sends a signal to the logic unit 38 that indicates detection of a voltage corresponding to the second voltage point across the DUT 32 over control line(s) 60. In response to these voltage indication signals, the logic unit 38 commands the counter 44 to start or stop counting. Following completion of a charge and/or discharge capacitance, the logic unit 38 can command the counter 44 to drive the display 18 to display the counted value(s). During display of the counted value(s), the logic unit 38 drives the display 18 to display a decimal point if display of a decimal point is appropriate for the preselected parameters associated with the capacitance measurement(s).

The user can instruct the measurement assembly 10 to commence electrical characteristic measurement of the DUT 32 by pressing one of the user input devices 14 (e.g., the start button). The user action can command the logic unit 38 to control the constant current subsystem 28 to start charging the DUT 32 and the remainder of the controller subsystem to carry out a charge capacitance measurement. Following the charge capacitance measurement, the logic unit 38 can control the constant current subsystem 28 to discharge the DUT 32 and the remainder of the controller subsystem to carry out a discharge capacitance measurement. Command signals from the logic unit 38 to the respective charge circuit 34 and discharge circuit 36 of the constant current subsystem 28 can be transmitted over control line(s) 62. As will be explained below, the logic unit 38 can control the measurement assembly 10 to make an ESR measurement of the DUT 32.

Figure 4:
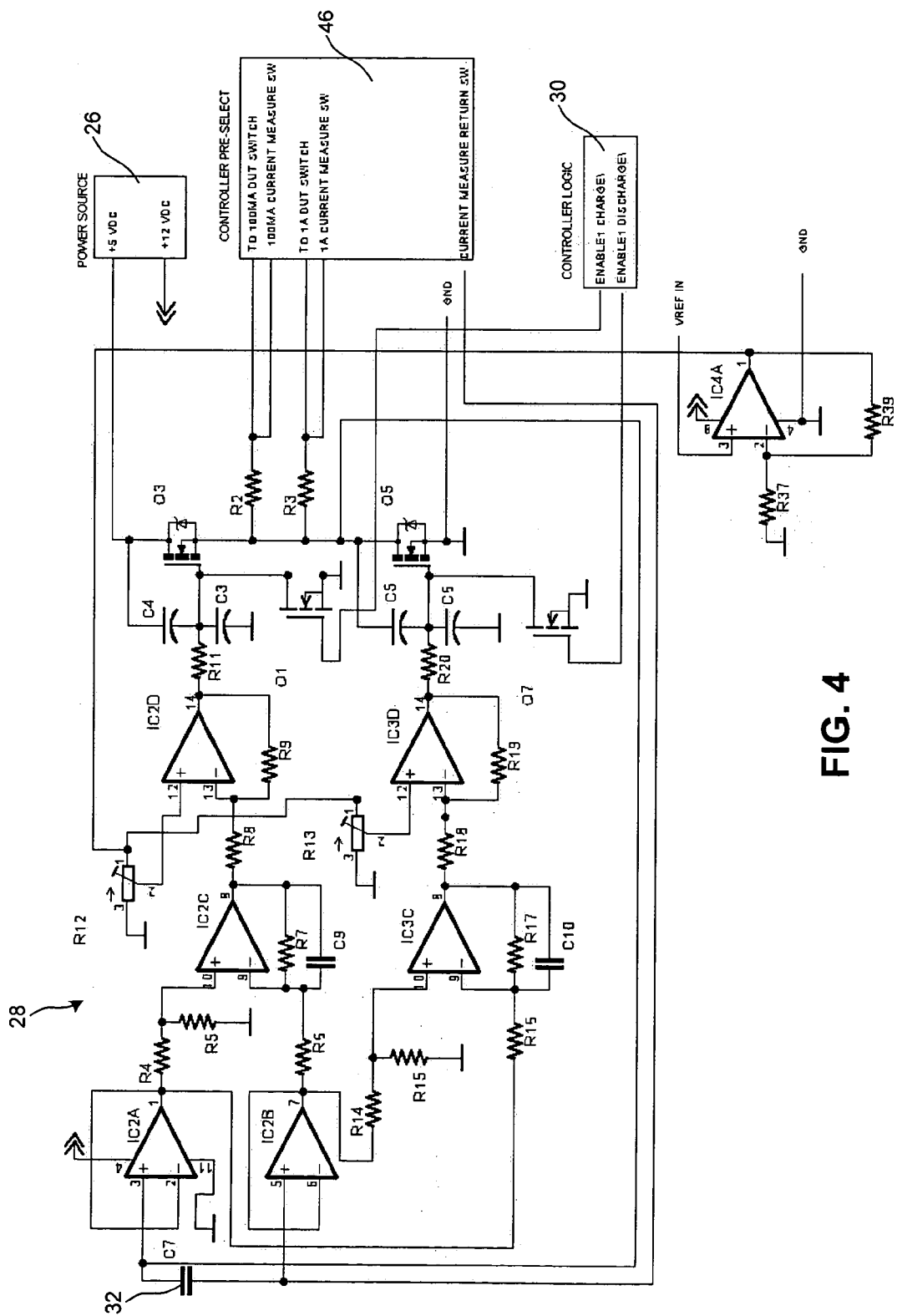
FIG. 4 is an electrical schematic diagram of a constant current subsystem of the measurement assembly.

With additional reference to FIG. 4, shown is an electrical schematic diagram of at least a portion of the constant current subsystem 28. The illustrated constant current subsystem 28 is configured to charge and discharge the DUT 32 with either 0.1 A or 1.0 A. The construction of similar circuits for charging and/or discharging the DUT 32 with other current values, including, but not limited to, 10 A will be apparent to one of ordinary skill in the art. In the example embodiment of FIG. 3, the power source 26 supplies +12 VDC for the purpose of powering IC2, IC3, and IC4.

The power source 26 supplies the constant current subsystem 28 with +5 VDC, which is modulated by Q3 in order to produce the constant current during charging of the DUT 32. The output of Q3 flows through either R2 or R3 into the preselection assembly 46 and then to the DUT 32. The preselection assembly 46 determines which resistor passes the constant current. The resistors R2 and R3 are current feedback resistors and respectively determines the preselected constant current value (e.g., 0.1 A or 1.0 A).

For the case where Q3 is charging the DUT 32, the voltage appearing across the selected current feedback resistor R2 or R3 is delivered through the preselection assembly 46 to respective inputs of a pair of unity-gain buffer amplifiers IC2A and IC2B. Outputs of amplifiers IC2A and IC2B are coupled to an input of a differential amplifier IC2C that provides gain to the current feedback voltage. An output of amplifier IC2C is coupled to an input of a comparator IC2D that compares the current feedback voltage at the input of comparator IC2D to a reference voltage derived from a variable resistance R12. An output signal of IC2D is a difference between the reference voltage and the current feedback voltage. The output signal of IC2D is applied to a gate of Q3 to control Q3 to modulate the current flowing to the DUT 32 so that the current has a generally constant value.

During discharging of the DUT 32, current from the DUT 32 flows through the preselection assembly 46, through a selected one of R2 or R3 and then to ground through Q5. Q5 modulates the current such that the current is kept at a generally constant value (e.g., 0.1 A or 1.0 A as determined by the selection of R2 or R3 by the preselection assembly 46). Operation is similar to the charging circuit except that the unity gain buffer amplifiers IC2A and IC2B couple the current feedback voltage to differential amplifier IC3C and then on to comparator IC3D, which receives a reference voltage from variable resistor R13.

The variable resistors R12 and R13 source voltage from amplifier IC4A. Amplifier IC4A derives voltage from a stable voltage reference source IC5 (FIG. 5) that forms part of the controller subsystem 30.

Starting and stopping the charging of the DUT 32 or the discharging of the DUT 32 are respectively effected by operation of transistors Q1 and Q7. Transistors Q1 and Q7 are gated by enable signals generated by the controller subsystem 30.

Figure 5:
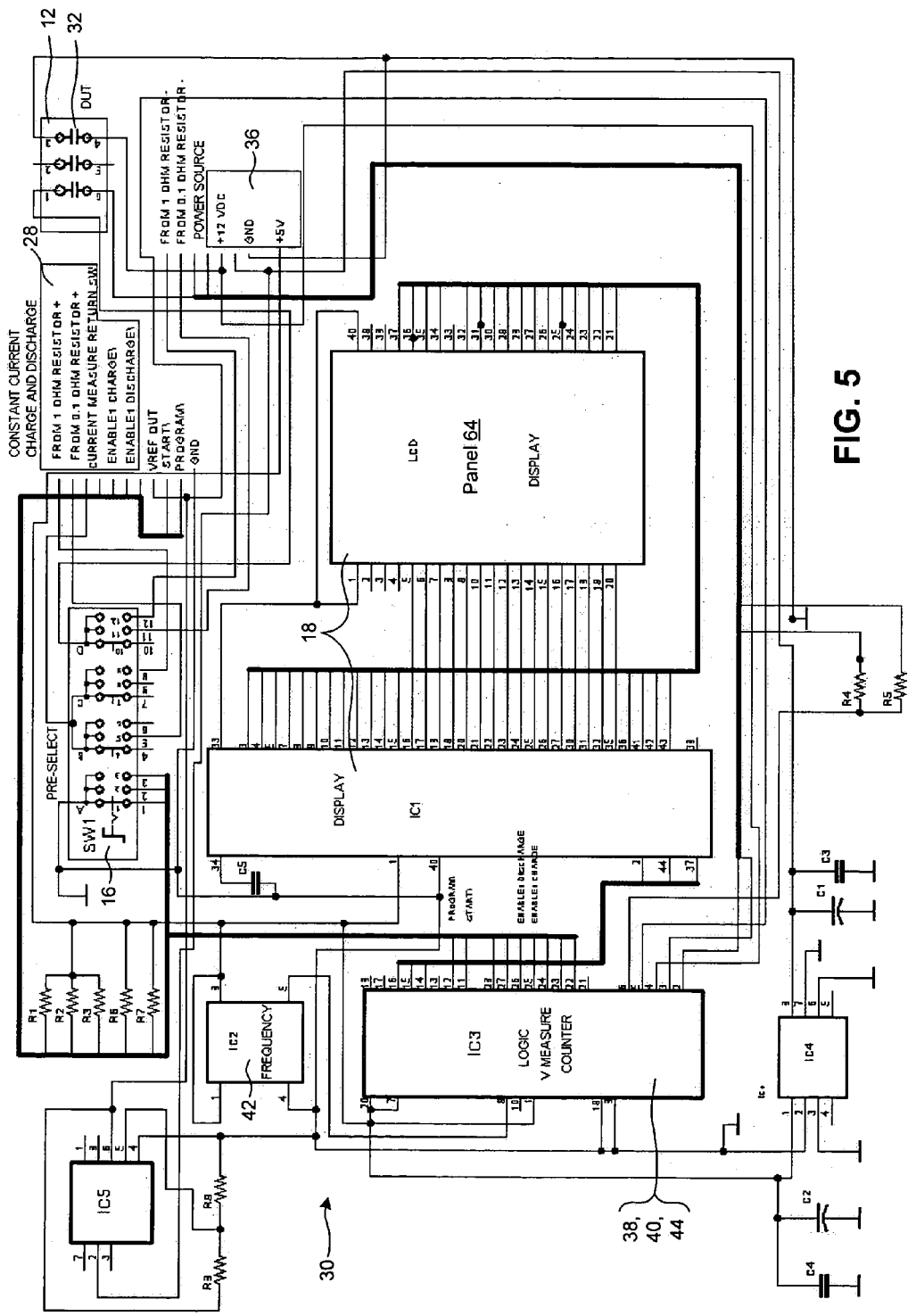
FIG. 5 is an electrical schematic diagram of a controller subsystem of the measurement assembly.

With additional reference to FIG. 5, shown is an example electrical schematic diagram for the controller subsystem 30 of the measurement assembly 10.

The logic unit 30, the voltage measuring device 40 and the counter 44 can be embodied in a single integrated package IC3. The integrated package IC3 can be comprised of a microprocessor with an integrated analog-to-digital (A/D) converter for converting an analog voltage measured across the DUT 32 to a digital value. In one embodiment, the output of the A/D converter is a voltage measurement from 0.000 volts to 5.120 volts. The clock 42 can be embodied as a crystal oscillator IC2. The constant current selection device 16 can be embodied as a multi-pole rotary switch SW1. The display 18 can include a driver IC1 and liquid crystal panel 64. Connection to the DUT 32 can be achieved using the test socket 12.

In operation, integrated package IC3 controls the generation of charge and discharge constant currents, measures the voltage across the DUT 32, and operates the counter 44 using a preselected scale factor. As indicated, the counter sources the counted value from the oscillator IC2. At the completion of a capacitance measurement, integrated package IC3 delivers the counted value result directly to the display driver IC1. The display driver IC1, in turn, drives the panel 64 to display the counted value. If appropriate, the integrated package IC3 also instructs the driver IC1 to drive the panel 64 to display a decimal point in a preselected location.

Charge Capacitance Measurement

As indicated, various electrical characteristics of a DUT 32 can be measured with the measurement assembly 10 by preselecting parameters that satisfy a governing equation and displaying a single monitored parameter. If desired, a decimal place can be added to the display.

For example, the charge capacitance of an EDLC can be measured using the measurement assembly 10. Although other working voltages for EDLCs may be possible, the description herein will focus on techniques for measuring the charge capacitance of an EDLC with either a 2.5 volt working voltage or a 5.0 volt working voltage. Modifications to the described techniques to measure the charge capacitance of an EDLC with a different working voltage will be apparent to one of ordinary skill in the art.

The measurement technique starts with the governing equation for determining charge capacitance of an EDLC. The governing equation is set forth below in equation 1, wherein C is the charge capacitance, I is a constant current applied to charge the capacitor, $\Delta t$ is the amount of time the capacitor takes to charge from a first voltage point to a second voltage point, and $\Delta V$ is the numerical difference between the first voltage point and the second voltage point.

$$C = \frac{I \cdot \Delta t}{\Delta V} \qquad \text{Eq. 1}$$

As indicated, parameters used to "solve" the governing equation are preselected. In one embodiment, the current value (I) and voltage difference ($\Delta V$) are preselected.

The current value can be preselected by the user from one or more predetermined values. For instance, the measurement assembly 10 can allow the user to preselect one of 0.1 A, 1.0 A or 10.0 A using the constant current selection device 16. The current value can be selected based on what may be expected to be a reasonable measurement time for the size of the capacitor being tested. It is assumed that the user of the measurement assembly 10 will have a reasonably high level of knowledge about EDLCs, if not capacitors in general, and this knowledge will help guide the user's preselection of the current value. In general, capacitors having a capacitance of a few hundred farads or more can be tested using the 10.0 A current value. Capacitors ranging from tens of millifarads to a few hundred farads generally can be measured in a reasonable time period using an appropriate one of the 0.1 A or the 1.0 A current values. Industry procedures for testing EDLCs also can be used for guidance as to what a reasonable measurement time may be for a given capacitance. These times may range from about a second to over a few hundred seconds. From this knowledge, the user can estimate which one of the predetermined currents may provide a reasonable measurement time as the measurement time is directly related to how long the application of the constant current will take to charge the capacitor. In many cases, the lowest current value available can be chosen so long as the length of measurement time is not excessively long.

Current value selection also can be guided by a desire to select a current that is low enough so that an initial voltage step (e.g., a relatively rapid rise in voltage of the capacitor at the commencement of charging before the charging becomes relatively linear) is smaller than twenty (20) percent of the working voltage of the capacitor. The measurement assembly 10 can be configured to detect an error in the measurement of charge capacitance if the user selects a current that invokes an initial voltage step that is greater than twenty percent of the working voltage. Error detection will be discussed in greater detail below.

Another criteria for current value selection can include the planned use for the capacitor. For instance, a user may pick a current value because that current value is the closest of the available current values to the current that may be applied to the capacitor in the user's application for the capacitor. It is noted that when measuring the capacitance of EDLCs, which are generally non-ideal capacitors, the capacitance measured by the measurement assembly 10 can depend on the constant current value. Therefore, selection of the current value that is closest to the current that may be applied during use of the capacitor can play a leading role in the current value selection process. Without intending to be bound by theory, the current values of 0.1 A, 1.0 A and 10.0 A provide the user with reasonable flexibility for testing most, if not all, EDLCs in a conveniently dimensioned and reasonably priced unit. Nevertheless, it will be appreciated that the measurement device 10 can be constructed to provide alternative and/or additional constant current values and that modifications to provide those alternative and/or additional constant current values will be apparent to one of ordinary skill in the art.

The voltage difference ($\Delta V$) is preselected as a function of the working voltage of the capacitor being tested. Using the International Electrotechnical Commission (IEC) recommendations for testing EDLCs, the first voltage point can be twenty percent of the working voltage and the second voltage point can be eighty percent of the working voltage. Therefore, in cases where the working voltage is 2.5 volts, the voltage difference can be preselected to be 1.5 volts. In cases where the working voltage is 5.0 volts, the voltage difference can be preselected to be 3.0 volts.

As should be appreciated, alternative voltage differences can be selected. For instance, if the working voltage is a value other than 2.5 volts or 5.0 volts, the voltage difference can be changed accordingly. Also, the first voltage point need not correspond to twenty percent of the working voltage and the second voltage point need not correspond to eighty percent of the working voltage. However, since the measured capacitance is, in effect, the average slope of a constant current charge of the capacitor over a voltage range, twenty and eighty percent takes into account a considerable portion of the working voltage while excluding generally non-linear portions of the charge profile (e.g., the first voltage step). Measuring in a smaller interval can be accomplished, but the measured capacitance will reflect the derivative of the charge profile curve over a smaller sample period and could lead to a different characterization of the DUT 32 than if the DUT 32 were measured over a longer portion of the charge profile curve.

The increment period of the counter 44 (e.g., the time that elapses between successive increments of the count maintained by the counter 44) can be preselected to coordinate with the voltage difference. In cases where the working voltage is 2.5 volts and the voltage difference is 1.5 volts, the increment period can be about 0.015 seconds (15 milliseconds). In cases where the working voltage is 5.0 volts and the voltage difference is 3.0 volts, the increment period can be about 0.03 seconds (30 milliseconds).

In the examples for the preselected values presented thus far, the increment period and the working voltage differ by a factor of one hundred and the current values are predetermined to be in multiples of ten. Of course, these parameters can be altered. For instance, the increment period can be decreased (e.g., an increment period of 1/200th of the voltage difference) and the current value can be proportionally increased (e.g., doubled to 0.2 A, 2.0 A or 20 A). These changes can be used to decrease or increase the $\Delta t$ accuracy of the measurement assembly 10 since the $\Delta t$ accuracy is plus or minus the length of the increment period. Alternatively, the current value can be changed to provide the user with different and/or additional current values when measuring electrical characteristics of the DUT 32.

Using the foregoing preselected parameters, the governing equation for the charge capacitance measurement can be rewritten as equation 2, where the counter value is the number of increment periods elapsed from the first voltage point to the second voltage point.

$$C = \frac{(I)(\text{counter value})(\text{increment period})}{\Delta V} \qquad \text{Eq. 2}$$

If the preselected values for the parameters of the governing equation are selected to satisfy the governing equation, then the counter value can be used to drive the display 18 without modification to represent the charge capacitance of the DUT 32. Depending on a desired unit (e.g., farads or millifarads), a decimal place can be added to the displayed counter value to assist in representing the charge capacitance of the DUT 32. If the preselected values for the parameters of the governing equation do not satisfy the equation (e.g., are selected such that the counter value is a fraction of the capacitance or a multiple of the capacitance), then the counter value can be appropriately scaled and the scaled counter value can be used to drive the display 18 without modification to represent the charge capacitance of the DUT 32. If desired, a decimal place can be added to the displayed scaled count.

The position of the decimal place with respect to the digits of the displayed counter value can be determined, in one embodiment, by a look-up table that cross references one or more preselected parameters for satisfying the governing equation. In an embodiment where the desired units for display of the charge capacitance is farads, table 1 provides an example look-up table for constant current values preselected from 0.1 A, 1.0 A and 10.0 A, working voltage values selected from 2.5 V and 5.0 V, a first voltage point of twenty percent of the working voltage, a second voltage point of eighty percent of the working voltage, and a count increment of 1/100th the voltage differential. In table 1, the reference numerals refer to the respective decimal point locations 24a through 24c shown in FIG. 2.

TABLE 1

| Constant Current Value | Decimal Place Position |
|---|---|
| 0.1 A | Decimal point location 24c (three places (digits) to the left starting from the right of the first digit 22a) |
| 1.0 A | Decimal point location 24b (two places (digits) to the left starting from the right of the first digit 22a) |
| 10 A | Decimal point location 24c (one place (digit) to the left starting from the right of the first digit 22a) |

Figure 6:
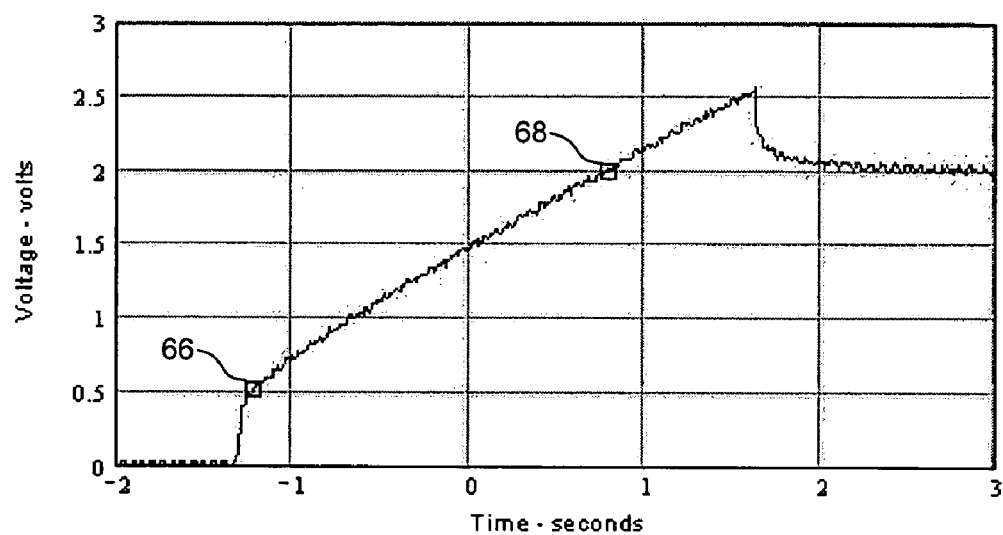
FIG. 6 is an example graph of voltage versus time during a charge capacitance measurement of a capacitor.

With additional reference to FIG. 6, shown is an example graph of voltage versus time during a charge capacitance measurement of an EDLC. The EDLC that generated the graph shown in FIG. 6 had a working voltage of 2.5 V and was tested with a preselected constant current of 1.0 A. A preselected measurement start point 66 was 0.5 volts (20% of the working voltage) and a preselected measurement stop point 68 was 2.0 volts (80% of the working voltage). The counter was incremented every 0.015 seconds starting when the voltage measuring device 40 detected a voltage across the tested EDLC at the preselected measurement start point 66 and stopping when the voltage measuring device 40 detected a voltage across the tested EDLC at the preselected measurement stop point 68. During this time, the measurement assembly 10 recorded a counter value of 125. Therefore, the display 18 was driven to read a five in the first digit 22a, a two in the second digit 22b, a one in the third digit 22c and, optionally, a zero in the fourth digit 22d. Using the preselected decimal place position, a decimal point was displayed between the second digit 22b and the third digit 22c at decimal point location 24b. A user observing the display 18 at this time would read the display as 1.25 farads.

Discharge Capacitance Measurement

Similar to the measurement of charge capacitance, the discharge capacitance of a DUT 32 can be measured with the measurement assembly 10. The measurement of discharge capacitance can be carried out using the same governing equation and same preselected parameters as for the charge capacitance. The difference in measuring discharge capacitance versus charge capacitance is that the capacitor begins in a charged state and is discharged at a constant current. The counter 44 is used to track how may preselected increment periods elapse as the capacitor discharges from the second voltage point to the first voltage point. The counter value at the end of the measurement cycle is representative of the discharge capacitance. If desired, a decimal place can be associated with the counter value to display discharge capacitance in a desired unit (e.g., farads or millifarads).

Due to the similarities between measuring discharge capacitance and charge capacitance, an abbreviated discussion of measuring discharge capacitance will be made herein. The reader's attention is directed to the foregoing description of measuring charge capacitance for a greater understanding of charge and/or discharge capacitance measurement in accordance with various aspects of the present invention.

Figure 7:
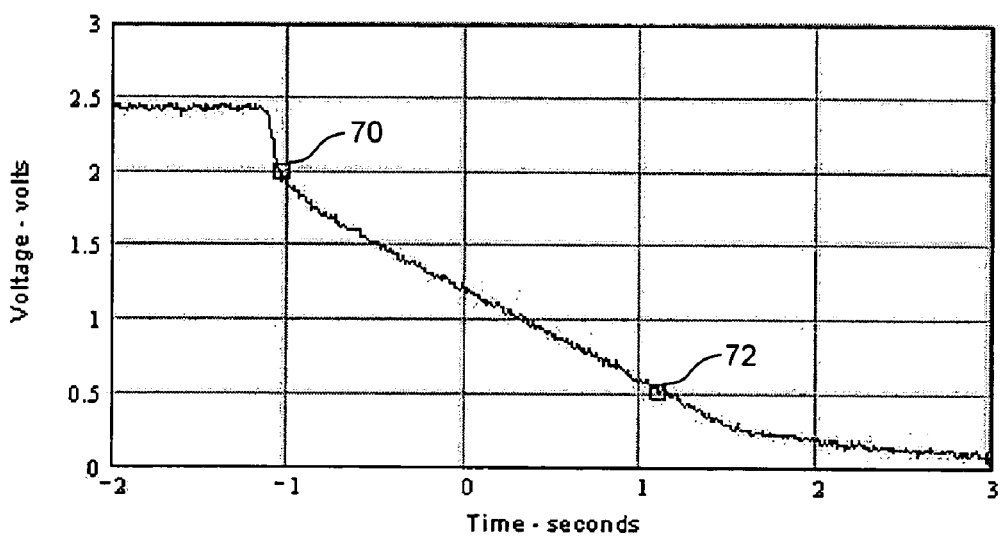
FIG. 7 is an example graph of voltage versus time during a discharge capacitance measurement of a capacitor.

With additional reference to FIG. 7, shown is an example graph of voltage versus time during a discharge capacitance measurement of an EDLC. The EDLC that generated the graph shown in FIG. 7 had a working voltage of 2.5 V and was tested with a preselected constant current of 1.0 A. A preselected measurement start point 70 was 2.0 volts (80% of the working voltage) and a preselected measurement stop point 72 was 0.5 volts (20% of the working voltage). The counter was incremented every 0.015 seconds starting when the voltage measuring device 40 detected a voltage across the tested EDLC at the preselected measurement start point 70 and stopping when the voltage measuring device 40 detected a voltage across the tested EDLC at the preselected measurement stop point 72. During this time, the measurement assembly 10 recorded a count value of 136. Therefore, the display 18 was driven to read a six in the first digit 22a, a three in the second digit 22b, a one in the third digit 22c and, optionally, a zero in the fourth digit 22d. Using the preselected decimal place position, a decimal point was displayed between the second digit 22b and the third digit 22c at decimal point location 24b. A user observing the display 18 at this time would read the display as 1.36 farads.

Equivalent Series Resistance (ESR) Measurement

The measurement assembly 10 can be used to measure the ESR of a DUT 32. Similar to the measurement of charge or discharge capacitance, measurement of ESR is associated with a governing equation such that a monitored value can be used to represent an ESR value when preselected parameters are used to satisfy the governing equation. In addition, a preselected decimal point can be used in association with the display of the monitored value to present the representation of ESR in a desired unit (e.g., ohms or milliohms).

In one embodiment, the ESR measurement is made using a DC resistance method. The ESR measurement technique starts with the governing equation for determining ESR of an EDLC. The governing equation is set forth below in equation 3, where V is voltage, I is a constant current, and R is resistance.

$$V = I \cdot R \qquad \text{Eq. 3}$$

As applied to measuring ESR of an EDLC, a constant current is assumed for parameter I. Therefore, when the value of I is preselected to satisfy the governing equation, parameter V can be used to represent resistance. As will be discussed below, V is a difference between a first measured voltage and a second measured voltage and this difference is representative of ESR. Therefore, the preselected parameter used to "solve" the governing equation is a preselected current value (I).

The current value can be preselected by the user from one or more predetermined values. For instance, the measurement assembly 10 can allow the user to preselect one of 0.1 A, 1.0 A or 10.0 A using the constant current selection device 16. The current value can be selected based on the criteria described above for charge capacitance measurement.

Figure 8:
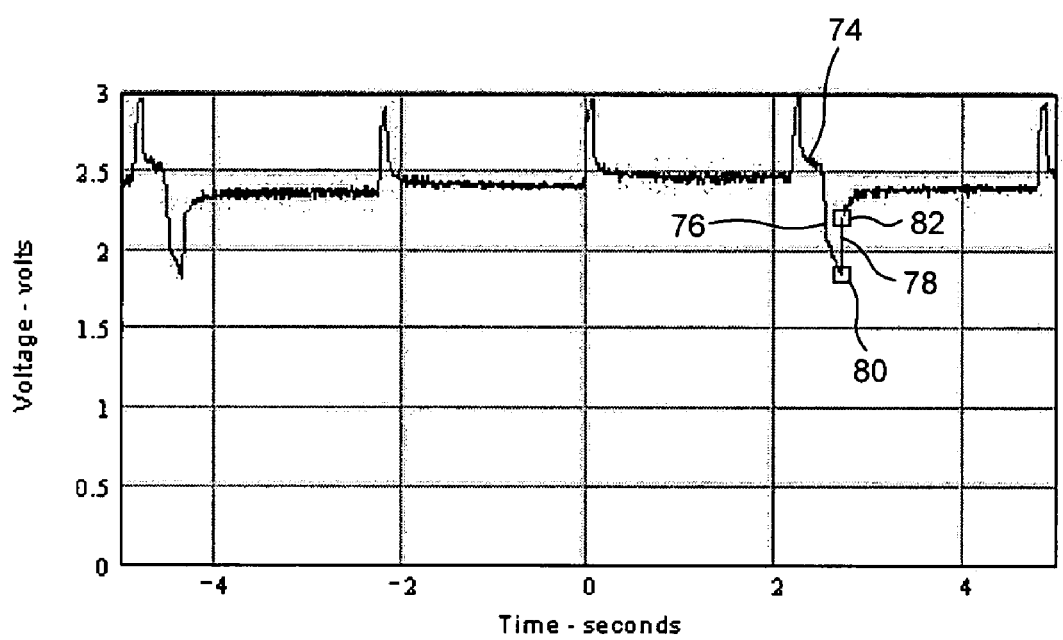
FIG. 8 is an example graph of voltage versus time during an equivalent series resistance (ESR) measurement of a capacitor.

Referring to FIG. 8, the DUT 32 is charged to a working voltage of the DUT 32 by periodically pulsing the DUT 32 with the preselected current. In the illustrated example, the working voltage is 2.5 volts, which is achieved at point 74. Once the working voltage is achieved, the DUT 32 is discharged at the preselected constant current rate. As is known, the commencement of the discharge results in a generally non-linear initial discharge step 76 followed by a mostly linear discharge profile during which the current is generally constant, and which is better shown in FIG. 7.

To measure ESR, the measurement assembly 10 is configured to detect the constant current (e.g., as a function of monitoring voltage across the DUT 32) as representing the end of the initial discharge step. Upon such detection, the measurement assembly 10 terminates the discharge by shutting off the discharge current. Termination of the discharge leads to an abrupt recovery in voltage across the DUT 32 indicated by rise 78. The slew rate corresponding to the rise 78 is relatively fast due to the nature of the amplifier driving the DUT 32 at a constant current. Accordingly, the rise 78 can be considered to be a distinct ESR step, the magnitude of which is considered to be proportional to the ESR of the DUT 32. Therefore, to represent ESR by the voltage parameter, the measurement assembly 10 is programmed to make a first voltage reading immediately before commanding shut off of the discharge current at point 80. The measurement assembly 10 then makes a second voltage reading at or near the end of the ESR step (rise 78) at point 82. In one embodiment, the second voltage reading is made at approximately ten milliseconds after the first voltage reading. It has been found that the ten millisecond interval approximates the duration of most ESR steps and, as a result, is a convenient way to implement this aspect of ESR measurement. Alternatively, actual monitoring for the end of the ESR step can be made.

Once the second voltage reading and the first voltage reading have been made, the logic unit 38 subtracts the first voltage reading from the second voltage reading to produce a voltage value corresponding to the change in voltage from point 80 to point 82. When the current is preselected to be 1.0 A or related thereto by one or more orders of magnitude (e.g., by a factor of 1/10th, 1/100th, 10, 100, etc.), the change in voltage from point 80 to point 82 represents ESR of the DUT 32.

As will be appreciated, the forgoing technique for measuring ESR differs from that proposed by the IEC, which calculates ESR from the point at which the initial discharge step 76 begins. The slope of the a generally linearly decreasing voltage portion of step 76 is then extrapolated back to the point in time where the discharge commenced to infer the step voltage. Such a technique involves relatively complex mathematical analysis. The technique used by the measurement assembly 10 avoids the complex mathematical analysis associated with the IEC's technique.

Once attained, the difference in voltage from point 80 to point 82 can be used to directly drive the display 18 as a representation of ESR. In the example embodiment where the digital output of the voltage measuring device 40 includes a decimal point (e.g., the output range of the example device 40 is 0.000 volts to 5.120 volts), then the resulting difference in voltage from point 80 to point 82 inherently includes a decimal point. Depending on the preselected current value and the desired output units (e.g., ohms or milliohms), the decimal point can be shifted or the voltage difference value can be shifted. Since ESR for most EDLCs is generally small (e.g., in the milliohm range), the measurement assembly 10 can be configured to display the voltage difference in milliohms and without a decimal point. Accordingly, for a preselected constant current of 1.0 A, the numerical value of the voltage difference is display but the decimal place is excluded from display, resulting in a display of ESR in milliohms. For example, the display 18 can be driven to show the digits of the voltage difference and not driven to show a decimal point in any of the decimal point locations 24a through 24c. If the preselected constant current is 10.0 A, then a decimal point can be inserted between the second digit 22b and the first digit 22a at decimal point location 24a.

If the preselected constant current is 0.1 A, then a decimal point location would be after a digit appearing to the right of the first digit 22a. Since, in the illustrated example, no digit is present to the right of the first digit 22a, the display 18 can be driven to display the voltage difference without a decimal point and shifted one digit to the left. For instance, if the preselected constant current is 0.1 A and the voltage difference, in volts, is 0.123, then the display can be driven to display a one in the fourth digit 22d, a two in the third digit 22c, a three in the second digit 22b and a zero in the first digit 22a. Such a display would be interpreted by the user as an ESR of 1230 milliohms, or 1.23 ohms.

As will be appreciated, the decimal point location or shift in displayed value can be stored in a look-up table for the desired output units (e.g., ohms or milliohms).

Returning to the example of FIG. 8, shown is an example graph of voltage versus time during an ESR measurement of an EDLC. The EDLC that generated the graph shown in FIG. 8 had a working voltage of 2.5 V and was tested with a preselected constant current of 1.0 A. The capacitor was pulsed to charge the capacitor to the working voltage, at which point a discharge of the capacitor was commenced. Following the initial discharge step 76, a first voltage across the capacitor was measured at point 80 and the discharge current was turned off. Following a 10 millisecond delay after measurement of the first voltage, a second voltage across the capacitor was measured at point 82. A difference between the first and second voltage measurements was 0.360 volts. The desired display units were in milliohms and the preselected constant current was 1.0 A. Accordingly, the display was driven to read a zero in the first digit 22a, a six in the second digit 22b, a three in the third digit 22c and, optionally, a zero in the fourth digit 22d. No decimal point was displayed. A user observing the display 18 at this time would read the display as 360 milliohms.

Operation of the Measurement Assembly

User interaction with the measurement assembly 10 to establish a preselected constant current value and a working voltage for the DUT 32 have been described above. Once selected, the user can control the measurement assembly 10 to commence measurement of electrical characteristics of the DUT 32, including charge capacitance measurement, discharge capacitance measurement and ESR measurement.

In one embodiment, the measurement assembly 10 can be programmed to automatically measure charge capacitance first. At the completion of the charge capacitance measurement, the DUT 32 will be charge to or near the working voltage of the DUT 32. Since charging to the working voltage with a series of pulses is the first step in measuring ESR, the measurement assembly 10 can be programmed to take advantage of the charging carried out during the charge capacitance measurement and measure ESR after the charge capacitance measurement has been made. After ESR measurement, the DUT 32 will be charged to or near the working voltage, which corresponds to the starting point of the discharge capacitance measurement. Therefore, the measurement assembly 10 can be programmed to take advantage of the state of the DUT 32 and conduct the discharge capacitance measurement after completion of the ESR measurement.

It is contemplated that some users may be most interested in the discharge capacitance value. Accordingly, the user can bypass the charge capacitance measurement and/or the ESR measurement and measure the discharge capacitance. In this case, the measurement assembly 10 will charge the DUT 32 to a voltage sufficient for commencement of the discharge capacitance test, if the DUT 32 is not already charge to this voltage, and conduct the discharge capacitance measurement.

The measurement assembly 10 is configured to display a value for an electrical characteristic relating to a DUT 32 and, in particular, an EDLC or conventional capacitor, where the value for the electrical characteristic is ascertained with minimal mathematical computation. In the embodiments described herein, division and multiplication are not used in ascertaining the electrical characteristics. Charge and discharge capacitance values are ascertained without mathematical computation and ESR is determined with only a subtraction operation. In the embodiments described herein, the measurement assembly 10 conveniently avoids use of a continuum or large number of testing parameters, such as constant current values and voltage differentials, in favor of a predefined set of testing parameters that combine to satisfy governing equations for the measurement of respective electrical characteristics.

The value of the electrical characteristic is output to a user by displaying a monitored or measured value of a different parameter that is directly representative of the electrical characteristic. Alternatively or in addition to displaying the monitored or measured parameter, the measurement assembly 10 can output the value of the parameter to a printer, to a storage medium (e.g., hard drive, flash memory, optical disk, etc.), to a general purpose computer, etc. If desired, the display can be driven to include a decimal point such that the displayed parameter value represents the electrical characteristic with a desired set of units. One may consider the placement of the decimal point as being guided by the governing equation for the measurement of the electrical parameter and the values of the preselected parameters that satisfy the governing equation.

Error Detection

As indicated, the measurement assembly 10 can be configured to detect an error in the measurement of charge or discharge capacitance. One reason why an error may arise is selection of a constant current value that invokes an initial voltage step that is greater than the starting point voltage (e.g., twenty percent of the working voltage).

Error detection can be carried out by deriving voltage difference values at preselected time intervals throughout the charge and discharge capacitance measurements. For example, commencing at the start voltage point, the logic unit 38 can control the measurement assembly 10 to take a series of pairs of voltage measurements until the end voltage point is reached. Each pair of voltage measurements can comprise a first error detection measurement and a second error detection measurement. The second error detection measurement is taken after the preselected time interval has elapsed since the first error detection measurement was made. In one embodiment, it has been found that one suitable preselected time interval is about 13.5 milliseconds. If desired, the second error detection measurement from one pair of voltage measurements can serve as the first error detection measurement for an immediately subsequent pair of voltage measurements. Alternatively, each pair of voltage measurements can have independently taken first and second error detection measurements.

A voltage difference for each preselected time interval can be derived by subtracting the first error detection measurement corresponding to the preselected time interval from the second error detection measurement corresponding to the preselected time interval. This difference corresponds to the change in voltage across the capacitor during the interval. Thereafter, the voltage difference can be compared against an error threshold voltage value. The error threshold voltage value can be different for charge capacitance measurement and discharge capacitance measurement. The respective charge and discharge error threshold voltage values can be established by determining a maximum slew rate of the constant current subsystem 28 during charging and discharging when connected to a resistor (not shown) of reasonably high value (e.g., about ten ohms or greater). The charging and discharging slew rates (expressed in units of volts per seconds) multiplied by the value of the preselected time interval (expressed in units of seconds) respectively result in a charge error threshold voltage and a discharge error threshold voltage.

If the magnitude of the voltage difference for any of the time intervals exceeds the appropriate charge or discharge error threshold voltage value, an error condition can be considered to be present. In this case, the logic unit 38 can output an error condition indication signal. In one embodiment, the error condition indication signal can be used to drive the display 18. For example, the value representative of capacitance (e.g., the value of the counter) can be displayed along with an indication that the user should have reason to question to the displayed value. For example, the display 18 can be toggled between displaying a message reading "Err" and the value representative of capacitance. Alternatively, an error light or LED can be illuminated on the measurement assembly 10. In another embodiment, a portion of the display 18 can be designated to display an error indication to the user.

If the magnitude of the voltage difference does not exceed the appropriate error threshold voltage value, no error condition is considered to be present. In this case, the value representative of capacitance (e.g., the value of the counter) will be displayed without an indication of an error to the user.

CONCLUSION

Although particular embodiments of the invention have been described in detail, it is understood that the invention is not limited correspondingly in scope, but includes all changes, modifications and equivalents coming within the spirit and terms of the claims appended hereto.

What is claimed is:

1. A measurement assembly for measuring an electrical characteristic of a capacitor under test, comprising:
    a constant current assembly for selectively charging the capacitor under test with a constant charge current and discharging the capacitor under test at a constant discharge current;
    a counter incremented during a measurement period of a selected one of the charging and discharging; and
    a display driven to display a value of the counter as a representation of capacitance of the capacitor under test; and
    further comprising a logic unit for detecting an error condition during the measurement period, the logic unit including logic to:
    determine a change in voltage across the capacitor during each of a plurality of time intervals;

compare the change in voltage for each time interval to a threshold value; and output an error condition indication signal if the change in voltage for any of the time intervals exceeds the threshold voltage.

2. The measurement assembly according to claim 1, wherein the capacitor is an electric double layer capacitor.

3. The measurement assembly according to claim 1, wherein the constant current assembly charges the capacitor and the counter value represents charge capacitance.

4. The measurement assembly according to claim 1, wherein the constant current assembly discharges the capacitor and the counter value represents discharge capacitance.

5. The measurement assembly according to claim 1, wherein the measurement period is defined by a start point voltage and a stop point voltage of the capacitor.

6. The measurement assembly according to claim 5, wherein the start point voltage and the stop point voltage are respectively preselected percentages of a working voltage of the capacitor.

7. The measurement assembly according to claim 5, further comprising a voltage measuring device for detecting the start point voltage and the stop point voltage.

8. The measurement assembly according to claim 5, wherein the start point voltage, the stop point voltage, a constant current value and an increment period of the counter are preselected to satisfy a governing equation for charge and discharge capacitance measurement.

9. The measurement assembly according to claim 1, the display is further driven to display a decimal place in a preselected position such that the representation of capacitance is shown in a desired unit.

10. The measurement assembly according to claim 9, wherein the preselected decimal place position is based on a governing equation for charge and discharge capacitance measurement and at least one preselected parameter selected to satisfy the governing equation.

11. The measurement assembly according to claim 9, wherein plural preselected decimal place positions are stored in a look-up table in association with values for at least one preselected parameter for measuring the electrical characteristic, the displayed decimal place derived from the look-up table based on a value of the preselected parameter used during measurement of the electrical characteristic.

12. The measurement assembly according to claim 1, further comprising a logic unit for measuring an equivalent series resistance (ESR) of the capacitor, the logic unit including logic to:

control the constant current assembly to begin a discharge of the capacitor;

control the constant current assembly to shut off the discharge of the capacitor after an initial discharge step is concluded to invoke a recovery rise in voltage across the capacitor; and measure a magnitude of the rise, a value of the magnitude of the rise being directly proportional to ESR.

13. The measurement assembly according to claim 12, wherein the logic unit for measuring an equivalent series resistance (ESR) of the capacitor further includes logic to drive the display to display the value of the magnitude of the rise as representing ESR.

14. The measurement assembly according to claim 13, wherein the logic unit for measuring an equivalent series resistance (ESR) of the capacitor further includes logic to drive the display to display the representation of ESR in a desired unit by a predetermined one of not showing a decimal place, showing a decimal place in a preselected position and shifting the value.

15. The measurement assembly according to claim 12, wherein the logic to measure the magnitude of the rise includes logic to determine a first voltage value across the capacitor prior to shut off of the discharge and determine a second voltage value across the capacitor after a predetermined period of time has elapsed after the determination of the first voltage value, a difference between the first and second voltage values being the magnitude of the rise.

16. The measurement assembly according to claim 12, wherein a constant current parameter is preselected to satisfy a governing equation for ESR measurement.

17. A method of measuring an electrical characteristic of a capacitor under test, comprising:

selectively charging the capacitor under test with a constant charge current or discharging the capacitor under test at a constant discharge current;

incrementing a counter during a measurement period of the selected one of the charging and discharging; and displaying a value of the counter as a representation of capacitance of the capacitor under test; and further comprising detecting an error condition during the measurement period by:

determining a change in voltage across the capacitor during each of a plurality of time intervals;

comparing the change in voltage for each time interval to a threshold value; and outputting an error condition indication signal if the change in voltage for any of the time intervals exceeds the threshold voltage.

18. The method according to claim 17, wherein the capacitor is an electric double layer capacitor.

19. The method according to claim 17, wherein the capacitor is charged and the counter value represents charge capacitance.

20. The method according to claim 17, wherein the capacitor is discharged and the counter value represents discharge capacitance.

21. The method according to claim 17, wherein the measurement period is defined by a start point voltage and a stop point voltage of the capacitor.

22. The method according to claim 21, wherein the start point voltage and the stop point voltage are respectively preselected percentages of a working voltage of the capacitor.

23. The method according to claim 21, further comprising detecting the start point voltage and the stop point voltage with a voltage measurement device.

24. The method according to claim 21, further comprising preselecting the start point voltage, the stop point voltage, a constant current value and an increment period of the counter to satisfy a governing equation for charge and discharge capacitance measurement.

25. The method according to claim 17, further comprising preselecting values for measurement parameters that in combination with the value of the counter satisfy a governing equation for charge and discharge capacitance measurement.

26. The method according to claim 17, further comprising driving the display to display a decimal place in a preselected position such that the representation of capacitance is shown in a desired unit.

27. The method according to claim 26, wherein the preselected decimal place position is based on a governing equation for charge and discharge capacitance measurement and at least one preselected parameter selected to satisfy the governing equation.

28. The method according to claim 26, wherein plural preselected decimal place positions are stored in a look-up table in association with values for at least one preselected parameter for measuring the electrical characteristic, the displayed decimal place derived from the look-up table based on a value of the preselected parameter used during measurement of the electrical characteristic.

29. The method according to claim 17, further comprising measuring an equivalent series resistance (ESR) of the capacitor by:
beginning a discharge of the capacitor;
shutting off the discharge of the capacitor after an initial discharge step is concluded to invoke a recovery rise in voltage across the capacitor; and
measuring a magnitude of the rise, a value of the magnitude of the rise being directly proportional to ESR.

30. The method according to claim 29, wherein measuring ESR further includes driving the display to display the value of the magnitude of the rise as representing ESR.

31. The method according to claim 30, wherein driving the display includes displaying the representation of ESR in a desired unit by a preselected one of not showing a decimal place, showing a decimal place in a preselected position and shifting the value.

32. The method according to claim 29, wherein measuring the magnitude of the rise includes determining a first voltage value across the capacitor prior to shut off of the discharge and determining a second voltage value across the capacitor after a predetermined period of time has elapsed after the determination of the first voltage value, a difference between the first and second voltage values being the magnitude of the rise.

33. The method according to claim 29, further comprising preselecting a constant current parameter for discharging the capacitor to satisfy a governing equation for ESR measurement.

34. A method of detecting an error condition during measurement of an electrical characteristic of a capacitor, the measurement including selectively charging or discharging the capacitor with a constant current and monitoring the capacitor over a measurement period, comprising:
during the measurement period, determining a change in voltage across the capacitor during each of a plurality of time intervals;
comparing the change in voltage for each time interval to a threshold value; and
outputting an error condition indication signal if the change in voltage for any of the time intervals exceeds the threshold voltage.

35. The method according to claim 34, wherein the capacitor is an electric double layer capacitor.

36. The method according to claim 34, wherein the measurement period is defined by a start point voltage and a stop point voltage of the capacitor.

37. The method according to claim 34, wherein the electrical characteristic is one of charge capacitance, discharge capacitance and combinations thereof.

38. The method according to claim 37, further comprising driving a display to indicate presence of a condition that relates to accuracy of the measurement of the electrical characteristic.

39. The method according to claim 34, further comprising driving a display to indicate presence of a condition that relates to accuracy of the measurement of the electrical characteristic.

40. A method of detecting an error condition during measurement of an electrical characteristic of a capacitor, the measurement including selectively charging or discharging the capacitor with a constant current and monitoring the capacitor over a measurement period, comprising:
during the measurement period, determining a change in voltage across the capacitor during each of a plurality of time intervals;
comparing the change in voltage for each time interval to a threshold value; and
outputting an error condition indication signal if the change in voltage for any of the time intervals exceeds the threshold voltage;
wherein the threshold value is determined by multiplying an appropriate one of a constant current source charge slew rate or a constant current source discharge slew rate with the time interval.

* * * * *

UNITED STATES PATENT AND TRADEMARK OFFICE
CERTIFICATE OF CORRECTION

PATENT NO.       : 7,148,697 B2
APPLICATION NO.  : 10/861550
DATED            : December 12, 2006
INVENTOR(S)      : Frank A. Doljack It is certified that error appears in the above-identified patent and that said Letters Patent is hereby corrected as shown below:

Column 8, line 45, replace "capacitor, At is" with --capacitor, $\Delta$t is--.

Signed and Sealed this

Sixth Day of March, 2007

JON W. DUDAS
*Director of the United States Patent and Trademark Office*